United States Patent
Chen et al.

(10) Patent No.: US 10,141,044 B2
(45) Date of Patent: Nov. 27, 2018

(54) MEMORY INTERFACE CIRCUIT HAVING SIGNAL DETECTOR FOR DETECTING CLOCK SIGNAL

(71) Applicant: MEDIATEK INC., Hsin-Chu (TW)

(72) Inventors: Shang-Pin Chen, Hsinchu County (TW); Chia-Yu Chan, Kaohsiung (TW); Bo-Wei Hsieh, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 7 days.

(21) Appl. No.: 15/247,870

(22) Filed: Aug. 25, 2016

(65) Prior Publication Data

US 2017/0221544 A1 Aug. 3, 2017

Related U.S. Application Data

(60) Provisional application No. 62/289,929, filed on Feb. 2, 2016.

(51) Int. Cl.
| | |
|---|---|
| G11C 11/4076 | (2006.01) |
| G11C 11/4093 | (2006.01) |
| G11C 11/4096 | (2006.01) |
| G11C 5/06 | (2006.01) |
| G11C 7/10 | (2006.01) |
| G11C 7/22 | (2006.01) |

(52) U.S. Cl.
CPC .......... *G11C 11/4076* (2013.01); *G11C 5/066* (2013.01); *G11C 7/1084* (2013.01); *G11C 7/225* (2013.01); *G11C 11/4093* (2013.01); *G11C 11/4096* (2013.01)

(58) Field of Classification Search
CPC ............ G11C 11/4076; G11C 11/4093; G11C 11/4096
See application file for complete search history.

(56) References Cited

U.S. PATENT DOCUMENTS

| | | | |
|---|---|---|---|
| 7,142,478 B2 * | 11/2006 | Suh | G06F 1/3225 365/149 |
| 2001/0043099 A1 | 11/2001 | Kawasaki | |
| 2004/0124887 A1 | 7/2004 | Schaefer | |
| 2007/0070782 A1 | 3/2007 | Lee | |
| 2011/0032787 A1 | 2/2011 | Kim | |
| 2011/0126039 A1 | 5/2011 | Kim | |
| 2012/0120746 A1 | 5/2012 | Noh | |
| 2013/0339775 A1 * | 12/2013 | Shaeffer | G11C 7/1072 713/323 |
| 2015/0227188 A1 | 8/2015 | Ware | |
| 2017/0222647 A1 * | 8/2017 | Chen | H03K 17/9631 |

* cited by examiner

*Primary Examiner* — Tri Hoang
(74) *Attorney, Agent, or Firm* — Winston Hsu

(57) ABSTRACT

A memory interface circuit includes a plurality of receivers and a signal detector. The plurality of receivers are arranged for receiving at least a clock signal and a plurality of command signals from a memory controller, respectively. The signal detector is arranged for detecting whether the memory interface circuit receives the clock signal or not to generate a detection result to enable or disable the plurality of receivers.

23 Claims, 4 Drawing Sheets

MEMORY INTERFACE CIRCUIT HAVING SIGNAL DETECTOR FOR DETECTING CLOCK SIGNAL

CROSS REFERENCE TO RELATED APPLICATIONS

This application claims the priority of U.S. Provisional Application No. 62/289,929, filed on Feb. 2, 2016, which is included herein by reference in its entirety.

BACKGROUND

A conventional dynamic random access memory (DRAM) module has many pins for receiving data signal, command signals, clock signals and a clock enable signal from a memory controller. In order to decrease the manufacturing cost, engineers always try to decrease quantity of pins. Therefore, how to remove one or more pins without influencing functions of the DRAM module is an important topic.

SUMMARY

It is therefore an objective of the present invention to provide a memory interface, which includes a signal detector for detecting whether a clock signal is existed to generate a detection result to enable or disable a plurality of receivers. By using the embodiments of the present invention, the conventional clock enable (CKE) pin can be removed from the memory controller and memory module.

According to one embodiment of the present invention, a memory interface circuit includes a plurality of receivers and a signal detector. The plurality of receivers are arranged for receiving at least a clock signal and a plurality of command signals from a memory controller, respectively. The signal detector is arranged for detecting whether the memory interface circuit receives the clock signal or not to generate a detection result to enable or disable the plurality of receivers.

According to another embodiment of the present invention, a memory system comprises a memory controller and a memory module, wherein the memory module comprises a memory interface circuit and a control circuit, and the memory interface comprises a plurality of receivers and a signal detector. The memory controller is arranged for generating at least a clock signal and a plurality of command signals. The plurality of receivers are arranged for receiving at least the clock signal and the plurality of command signals from the memory controller, respectively, to generate a plurality of output signals. The signal detector is arranged for detecting whether the memory interface receives the clock signal or not to generate a detection result to enable or disable the plurality of receivers. The control circuit is arranged for receiving plurality of output signals from the memory interface circuit to access a memory array within the memory module.

According to another embodiment of the present invention, a control method of a memory interface circuit is provided, wherein the memory interface circuit comprises a plurality of receivers for receiving at least a clock signal and a plurality of command signals from a memory controller, respectively, and the control method comprises: detecting whether the memory interface circuit receives the clock signal or not to generate a detection result to enable or disable the plurality of receivers.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
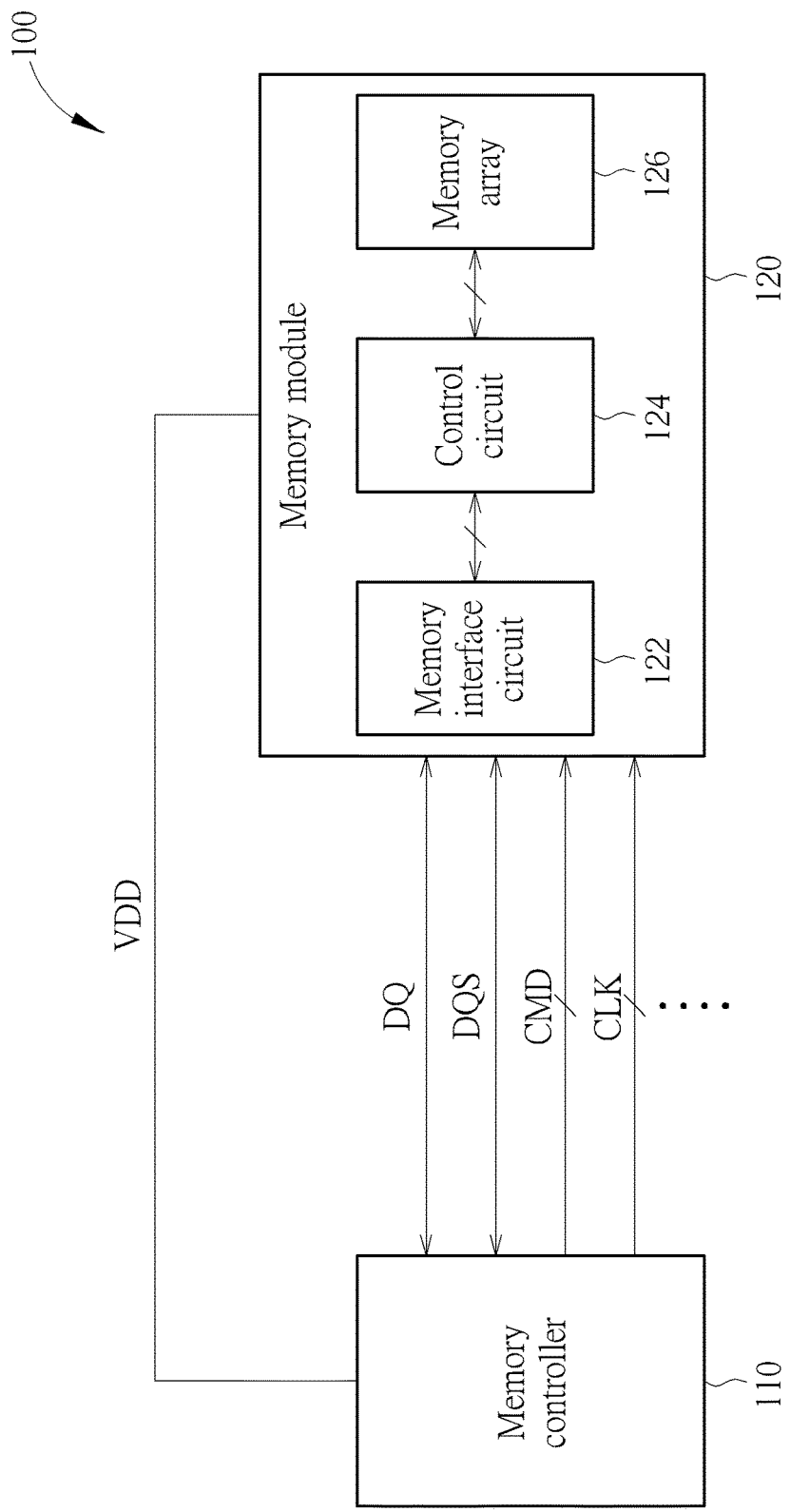
FIG. 1 is a diagram illustrating a memory system according to one embodiment of the present invention.

Please refer to FIG. 1, which is a diagram illustrating a memory system 100 according to one embodiment of the present invention. As shown in FIG. 1, the memory system 100 comprises a memory controller 110 and a memory module 120 supplied by a supply voltage VDD, where the memory module 120 comprises a memory interface circuit 122, a control circuit 124 and a memory array 126. In this embodiment, the memory controller 110 and the memory module 120 are connected via a plurality of connection lines, where the connection lines are used to transmit at least a bi-directional data signal DQ, a bi-directional data strobe signal DQS, a plurality of command signals CMDs and a differential clock signal CLK. In addition, in this embodiment, the memory system 100 is a volatile memory system such as a DRAM system, that is the memory controller 110 is the DRAM memory controller, and the memory module 120 is a DRAM memory module.

When the memory system 100 is implemented by the DRAM system the command signals may comprise at least a row address strobe, a column address strobe, and a write enable signal. In addition, the clock signal or the command signals shown in FIG. 1 can be single-directional or bi-directional.

In the operations of the memory system 100, the memory controller 110 is arranged to receive a request from a host or a processor, and to transmit at least a portion of the data signal DQ, data strobe signal DQS, command signals CMDs and the clock signal CLK to access the memory module 120. In addition, the memory controller 110 may comprise associated circuits, such an address decoder, a processing circuit, a write/read buffer, a control logic and an arbiter, to perform the related operations. The memory interface circuit 122 is arranged to receive the data signal DQ, data strobe signal DQS, command signals CMDs and the clock signal CLK from the memory controller 110, and to selectively output a plurality of output signals to the control circuit 124 or not according to the received signals. The control circuit 124 may comprise a read/write controller, a row decoder and a column decoder, and the control circuit 124 is arranged to receive the output signals from the memory interface circuit 122 to access the memory array 126.

In this embodiment, the memory system 100 does not have a conventional clock enable (CKE) pin, and the memory interface circuit 122 is arranged to detect whether the memory interface circuit 122 receives the clock signal CLK or not to generate a detection result to enable or disable a plurality of receivers within the memory interface circuit 122. That is, if the memory interface circuit 122 receives the clock signal CLK from the memory controller 110, the receivers within the memory interface circuit 122 are enabled to generate the outputs to the control circuit 124 according to the received signals; and if the memory interface circuit 122 does not receive the clock signal CLK or any other clock signal from the memory controller 110, the receivers within the memory interface circuit 122 are disabled, and the control circuit 124 will not receive the related signals to access the memory array 126.

Because the embodiments of the present invention focus on the designs of the memory interface circuit 122, detailed descriptions about the other elements are therefore omitted here.

Figure 2:
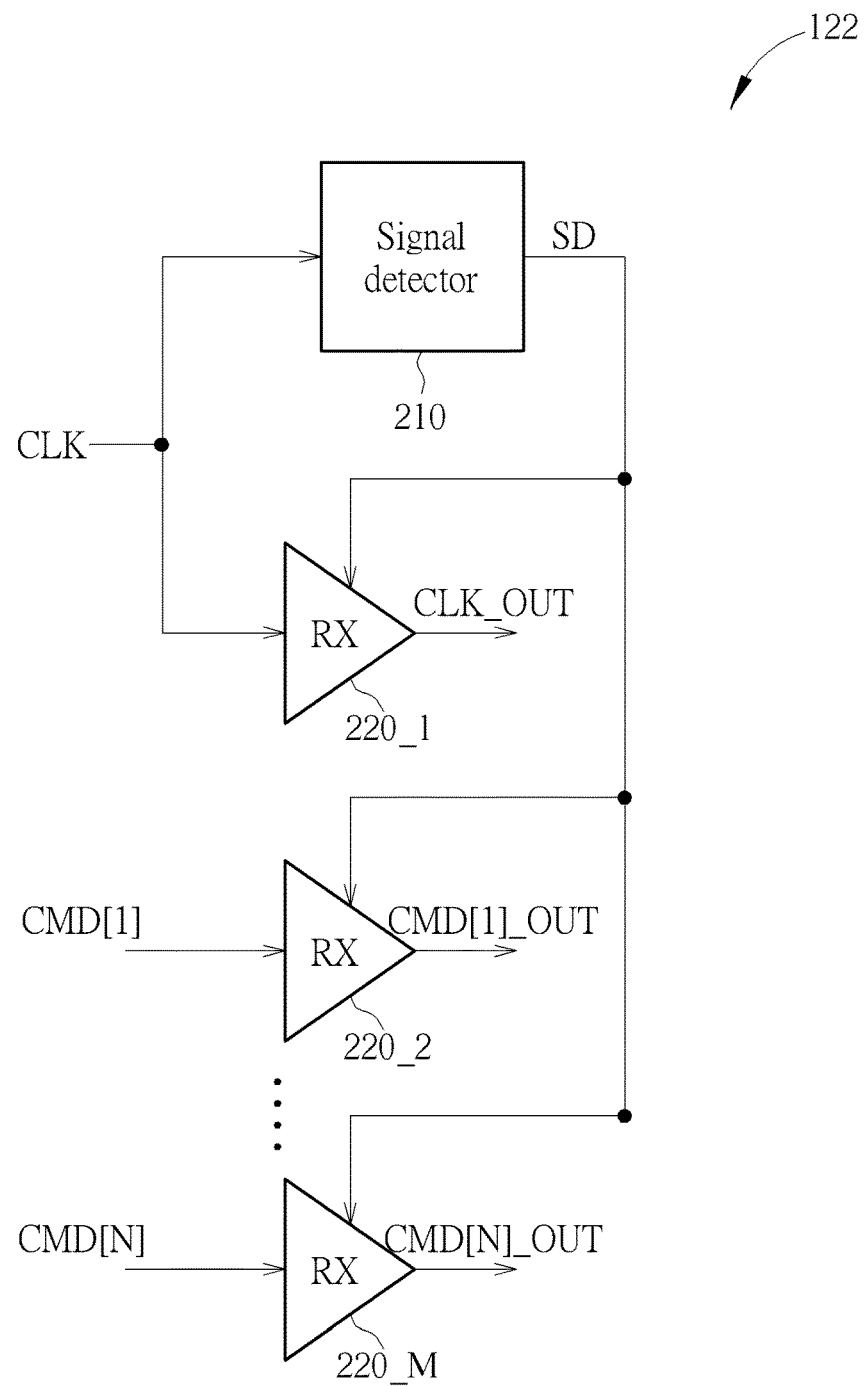
FIG. 2 is a diagram illustrating the memory interface circuit according to one embodiment of the present invention.

Please refer to FIG. 2, which is a diagram illustrating the memory interface circuit 122 according to one embodiment of the present invention. As shown in FIG. 2, the memory interface circuit 122 comprises a signal detector 210 and a plurality of receivers 220_1-220_M. The signal detector 210 is connected to a clock pin of the memory module 120, and is arranged to detect whether the memory interface circuit 122 receives the clock signal CLK or not to generate a detection result SD to enable or disable the receivers 220_1-220_M. In this embodiment, the signal detector 210 may detect whether a signal swing on the clock pin is greater than a threshold Vth or not to generate the detection result SD, that is if the signal swing is greater than the threshold Vth, the detection result SD has a higher voltage level to indicate that the memory interface circuit 122 receives the clock signal; and if the signal swing is lower than the threshold Vth, the detection result SD has a lower voltage level to indicate that the memory interface circuit 122 does not receive the clock signal. In another embodiment, the signal detector 210 may comprise a hysteresis comparator to determine the clock signal, for example, if the signal swing is greater than a first threshold, the signal detector 210 starts to generate the detection result SD that has the higher voltage level; and if the signal swing is less than a second threshold different from the first threshold, the signal detector starts to generate the detection result that has the lower voltage level.

The detection result SD is used to enable or disable the receivers 220_1-220_M. When the detection result SD indicates that the memory interface circuit 122 receives the clock signal CLK, the detection result SD enables the receivers 220_1-220_M; meanwhile, the receiver 220_1 receives the clock signal CLK to generate an output clock signal CLK_OUT to the control circuit 124, and the receiver 220_2-220_M receive the command signals CMD[1]-CMD[N] to generate output command signals CMD[1]_OUT-CMD[N]_OUT, respectively, to the control circuit 124. In addition, when the detection result SD indicates that the memory interface circuit 122 does not receive the clock signal CLK, the detection result SD disables the receivers 220_1-220_M, that is the receivers 220_1-220_M will not output the output clock signal CLK_OUT and the output command signals CMD[1]_OUT-CMD[N]_OUT to the control circuit 124, that is the control circuit 124 does not work to access the memory array 126.

Figure 3:
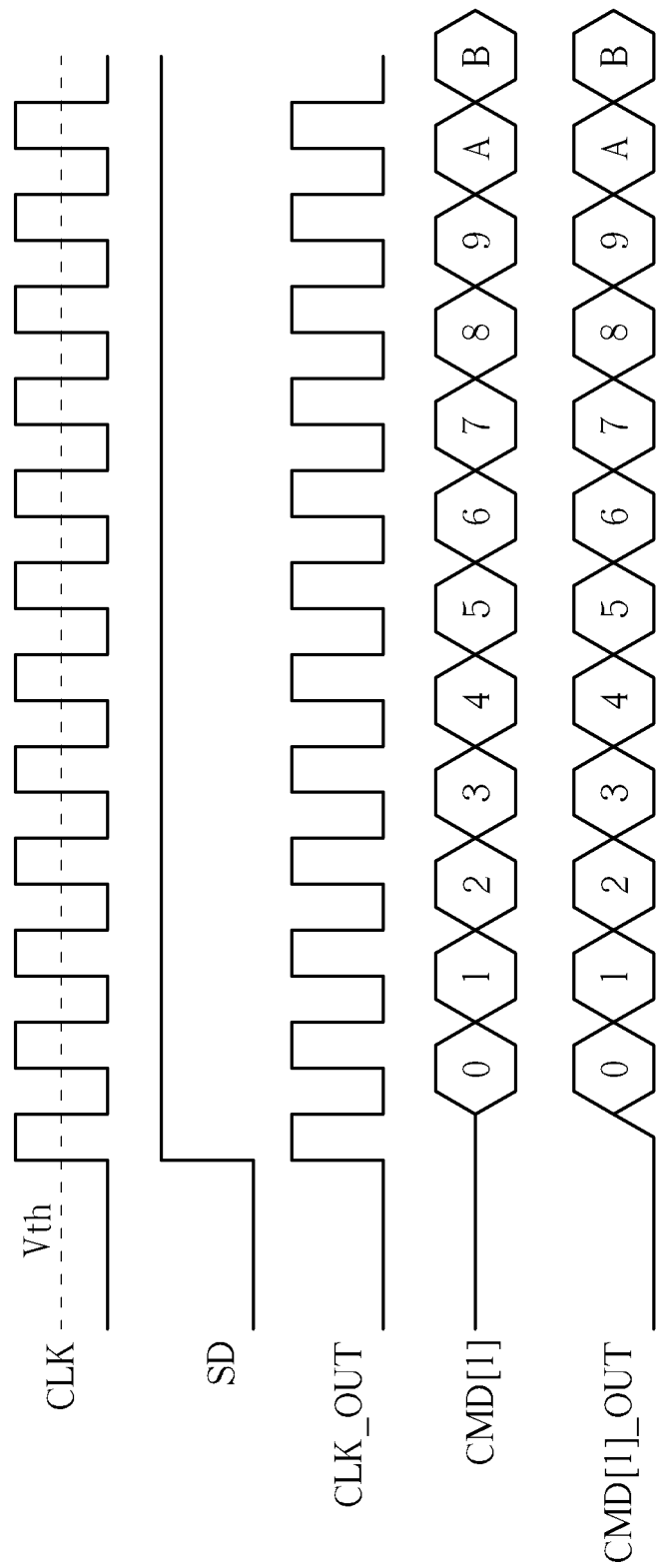
FIG. 3 shows a timing diagram of some signals shown in FIG. 2 according to one embodiment of the present invention.

FIG. 3 shows a timing diagram of some signals shown in FIG. 2 according to one embodiment of the present invention. It is noted that, in the embodiment shown in FIG. 3, the output clock signal CLK_OUT is substantially equal to the clock signal CLK, and the command signal CMD[1] is substantially equal to the output command signal CMD[1]_OUT, however, this is not a limitation of the present invention. In another embodiment, the output clock signal CLK_OUT and the command signal CMD[1] may be generated to satisfy the logical requirements of the memory module 120.

Figure 4:
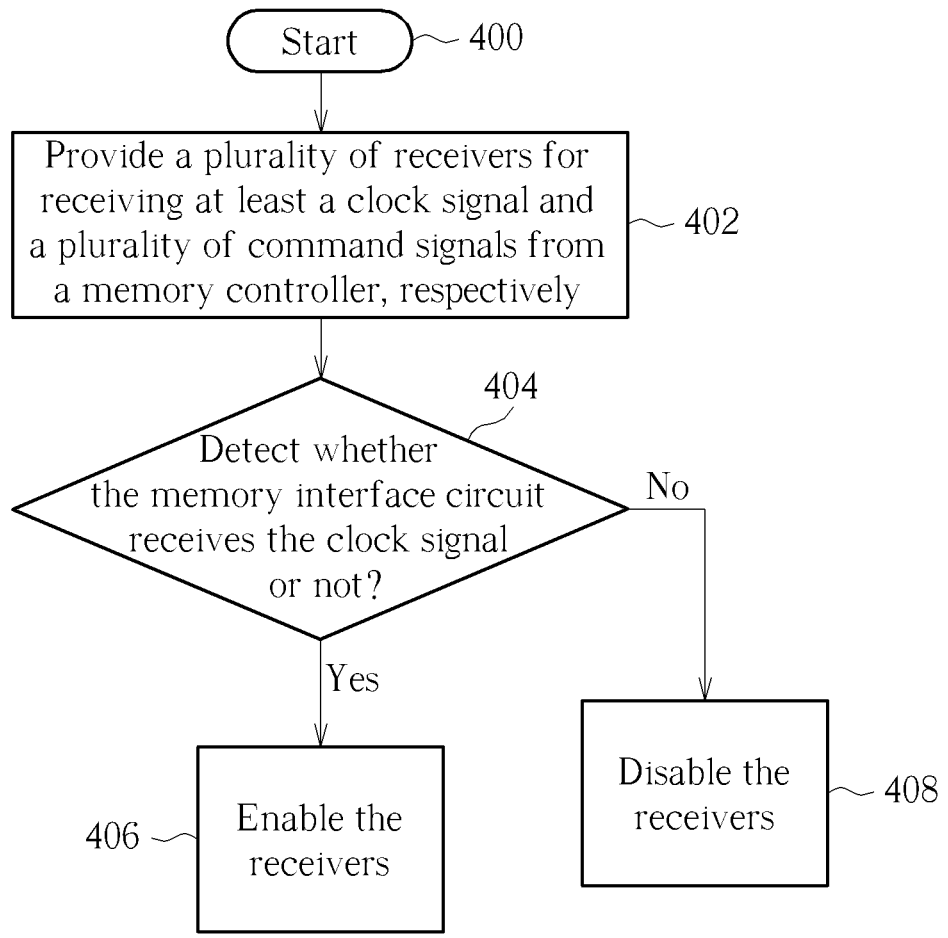
FIG. 4 is a flowchart of a control method of a memory interface circuit according to one embodiment of the present invention.

FIG. 4 is a flowchart of a control method of a memory interface circuit according to one embodiment of the present invention. Referring to FIGS. 1-4 and the aforementioned disclosure, the flow is described as follows.

Step 400: the flow starts.

Step 402: provide a plurality of receivers for receiving at least a clock signal and a plurality of command signals from a memory controller, respectively.

Step 404: detect whether the memory interface circuit receives the clock signal or not? If yes, the flow enters Step 406; if not, the flow enters Step 408.

Step 406: enable the receivers.

Step 408: disable the receivers.

Briefly summarized, in the memory system of the present invention, the memory interface circuit uses a signal detector to detect whether the memory interface circuit receives a clock signal from a memory controller or not to generate a detection result, and the detection result is arranged to enable or disable a plurality of receivers. Therefore, the conventional clock enable (CKE) signal and the clock enable pin can be removed from the memory system, thereby the manufacturing cost may be lowered, and the memory designs can be more flexible.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory interface circuit, comprising:
   a plurality of receivers, for receiving at least a clock signal and a plurality of command signals from a memory controller, respectively; and
   a signal detector, for detecting whether the memory interface circuit receives the clock signal or not, without using a clock enable signal from a pin of a memory module, to generate a detection result to enable or disable the plurality of receivers;
   wherein the signal detector detects a swing of the clock signal to generate the detection result and when the swing of the clock signal is greater than a first threshold, the signal detector starts to generate the detection result to enable the plurality of receivers; and when the swing of the clock signal is less than a second threshold, the signal detector starts to generate the detection result to disable the plurality of receivers.

2. The memory interface circuit of claim 1, wherein when the detection result indicates that the memory interface circuit receives the clock signal, the detection result enables the plurality of receivers; and when the detection result indicates that the memory interface circuit does not receive the clock signal, the detection result disables the plurality of receivers.

3. The memory interface circuit of claim 2, wherein when the detection result indicates that the memory interface receives the clock signal, the detection result enables the plurality of receivers to receive the at least the clock signal and the plurality of command signals from the memory controller, and to generate an output clock signal and a plurality of output command signals to a control circuit of a memory module, respectively; and when the detection result indicates that the memory interface circuit does not receive the clock signal, the detection result disables the plurality of receivers to not output any signal to the control circuit of the memory module.

4. The memory interface circuit of claim 1, wherein the memory interface circuit is applied in a dynamic random access memory (DRAM).

5. A memory system, comprising:
a memory controller, for generating at least a clock signal and a plurality of command signals;
a memory module, comprising:
a memory interface circuit, comprising:
a plurality of receivers, for receiving at least the clock signal and the plurality of command signals from the memory controller, respectively, to generate a plurality of output signals; and
a signal detector, for detecting whether the memory interface receives the clock signal or not, without using a clock enable signal from a pin of the memory module, to generate a detection result to enable or disable the plurality of receivers; and
a control circuit, for receiving plurality of output signals from the memory interface circuit to access a memory array within the memory module;
wherein the signal detector detects a swing of the clock signal to generate the detection result and when the swing of the clock signal is greater than a first threshold, the signal detector starts to generate the detection result to enable the plurality of receivers; and when the swing of the clock signal is less than a second threshold, the signal detector starts to generate the detection result to disable the plurality of receivers.

6. The memory system of claim 5, wherein when the detection result indicates that the memory interface circuit receives the clock signal, the detection result enables the plurality of receivers; and when the detection result indicates that the memory interface circuit does not receive the clock signal, the detection result disables the plurality of receivers.

7. The memory system of claim 6, wherein when the detection result indicates that the memory interface circuit receives the clock signal, the detection result enables the plurality of receivers to receive the at least the clock signal and the plurality of command signals from the memory controller, and to generate the output signals comprising an output clock signal and a plurality of output command signals to the control circuit, respectively; and when the detection result indicates that the memory interface circuit does not receive the clock signal, the detection result disables the plurality of receivers to not output any signal to the control circuit of the memory module.

8. The memory system of claim 5, wherein the memory controller is a dynamic random access memory (DRAM) controller, and the memory module is a DRAM module.

9. A control method of a memory interface circuit, wherein the memory interface comprises a plurality of receivers for receiving at least a clock signal and a plurality of command signals from a memory controller, respectively, and the control method comprises:
detecting, by using a signal detector, whether the memory interface circuit receives the clock signal or not, without using a clock enable signal from a pin of a memory module, to generate a detection result to enable or disable the plurality of receivers;
wherein the signal detector detects a swing of the clock signal to generate the detection result and when the swing of the clock signal is greater than a first threshold, the signal detector starts to generate the detection result to enable the plurality of receivers; and when the swing of the clock signal is less than a second threshold, the signal detector starts to generate the detection result to disable the plurality of receivers.

10. The control method of claim 9, wherein the step of detecting whether the memory interface circuit receives the clock signal or not to generate the detection result to enable or disable the plurality of receivers comprises:
when the detection result indicates that the memory interface circuit receives the clock signal, the detection result enables the plurality of receivers; and
when the detection result indicates that the memory interface circuit does not receive the clock signal, the detection result disables the plurality of receivers.

11. The control method of claim 10, wherein the step of detecting whether the memory interface circuit receives the clock signal or not to generate the detection result to enable or disable the plurality of receivers comprises:
when the detection result indicates that the memory interface circuit receives the clock signal, the detection result enables the plurality of receivers to receive the at least the clock signal and the plurality of command signals from the memory controller, and to generate an output clock signal and a plurality of output command signals to a control circuit of a memory module, respectively; and
when the detection result indicates that the memory interface circuit does not receive the clock signal, the detection result disables the plurality of receivers to not output any signal to the control circuit of the memory module.

12. The control method of claim 9, wherein the step of detecting whether the memory interface circuit receives the clock signal or not to generate the detection result comprises:
detecting a swing of the clock signal to generate the detection result.

13. The control method of claim 12, wherein the step of detecting whether the memory interface circuit receives the clock signal or not to generate the detection result comprises:
detecting whether the swing of the clock signal is greater than a threshold or not to generate the detection result.

14. The control method of claim 9, wherein the memory interface circuit is applied in a dynamic random access memory (DRAM).

15. The memory interface circuit of claim 1, wherein the signal detector detects whether the memory interface circuit receives the clock signal or not, without using any other signals from pins of the memory module, to generate the detection result to enable or disable the plurality of receivers.

16. The memory system of claim 5, wherein the signal detector detects whether the memory interface circuit receives the clock signal or not, without using any other signals from pins of the memory module, to generate the detection result to enable or disable the plurality of receivers.

17. The control method of claim 9, wherein the step of detecting whether the memory interface circuit receives the clock signal or not comprises:
detecting whether the memory interface circuit receives the clock signal or not, without using any other signals from pins of the memory module, to generate the detection result to enable or disable the plurality of receivers.

18. A memory interface circuit, comprising:
a plurality of receivers, for receiving at least a clock signal and a plurality of command signals from a memory controller, respectively; and
a signal detector, for detecting whether the memory interface circuit receives the clock signal or not to generate a detection result to enable or disable the plurality of receivers;
wherein the signal detector detects a swing of the clock signal to generate the detection result; and when the swing of the clock signal is greater than a first threshold, the signal detector starts to generate the detection result to enable the plurality of receivers; and when the swing of the clock signal is less than a second threshold, the signal detector starts to generate the detection result to disable the plurality of receivers.

19. The memory interface circuit of claim 18, wherein when the detection result indicates that the memory interface circuit receives the clock signal, the detection result enables the plurality of receivers; and when the detection result indicates that the memory interface circuit does not receive the clock signal, the detection result disables the plurality of receivers.

20. The memory interface circuit of claim 19, wherein when the detection result indicates that the memory interface receives the clock signal, the detection result enables the plurality of receivers to receive the at least the clock signal and the plurality of command signals from the memory controller, and to generate an output clock signal and a plurality of output command signals to a control circuit of a memory module, respectively; and when the detection result indicates that the memory interface circuit does not receive the clock signal, the detection result disables the plurality of receivers to not output any signal to the control circuit of the memory module.

21. A memory system, comprising:
a memory controller, for generating at least a clock signal and a plurality of command signals;
a memory module, comprising:
a memory interface circuit, comprising:
a plurality of receivers, for receiving at least the clock signal and the plurality of command signals from the memory controller, respectively, to generate a plurality of output signals; and
a signal detector, for detecting whether the memory interface receives the clock signal or not to generate a detection result to enable or disable the plurality of receivers; and
a control circuit, for receiving plurality of output signals from the memory interface circuit to access a memory array within the memory module;
wherein the signal detector detects a swing of the clock signal to generate the detection result; and when the swing of the clock signal is greater than a first threshold, the signal detector starts to generate the detection result to enable the plurality of receivers; and when the swing of the clock signal is less than a second threshold, the signal detector starts to generate the detection result to disable the plurality of receivers.

22. The memory system of claim 21, wherein when the detection result indicates that the memory interface circuit receives the clock signal, the detection result enables the plurality of receivers; and when the detection result indicates that the memory interface circuit does not receive the clock signal, the detection result disables the plurality of receivers.

23. The memory system of claim 22, wherein when the detection result indicates that the memory interface circuit receives the clock signal, the detection result enables the plurality of receivers to receive the at least the clock signal and the plurality of command signals from the memory controller, and to generate the output signals comprising an output clock signal and a plurality of output command signals to the control circuit, respectively; and when the detection result indicates that the memory interface circuit does not receive the clock signal, the detection result disables the plurality of receivers to not output any signal to the control circuit of the memory module.

* * * * *